(12) United States Patent
Bhandarkar

(10) Patent No.: US 11,264,842 B2
(45) Date of Patent: Mar. 1, 2022

(54) FOREIGN OBJECT DETECTION IN WIRELESS CHARGING SYSTEMS AND RELATED SYSTEMS, METHODS, AND DEVICES

(71) Applicant: Microchip Technology Incorporated, Chandler, AZ (US)

(72) Inventor: Santosh Bhandarkar, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/949,003

(22) Filed: Oct. 8, 2020

(65) Prior Publication Data

US 2021/0281120 A1 Sep. 9, 2021

Related U.S. Application Data

(60) Provisional application No. 62/984,722, filed on Mar. 3, 2020.

(51) Int. Cl.
*H02J 50/60* (2016.01)
*H02J 50/12* (2016.01)
(Continued)

(52) U.S. Cl.
CPC .......... *H02J 50/60* (2016.02); *G01R 27/2611* (2013.01); *H02J 50/12* (2016.02); *H02J 50/402* (2020.01)

(58) Field of Classification Search
CPC .......... H02J 5/005; H02J 7/0047; H02J 7/025; H02J 50/10; H02J 50/12; H02J 50/402; H02J 50/60
(Continued)

(56) References Cited

U.S. PATENT DOCUMENTS 9,130,395 B2 9/2015 Jung
2010/0219796 A1 9/2010 Kallmyer
(Continued)

FOREIGN PATENT DOCUMENTS

| WO | 2018/222287 A1 | 12/2018 |
| WO | 2020/003314 A1 | 1/2020 |
| WO | 2020/015746 A1 | 1/2020 |

OTHER PUBLICATIONS

"The Qi Wireless Power Transfer System Power Class 0 Specification," Part 4: Reference Designs, Version 1.2.4, Qi Wireless Power Consortium, Feb. 2018, 363 pages.
(Continued)

*Primary Examiner* — Levi Gannon
(74) *Attorney, Agent, or Firm* — TraskBritt

(57) ABSTRACT

Foreign object detection for wireless power transmitters and related systems, methods, and devices are disclosed. A controller for a wireless power transmitter includes a processing core and an analog to digital converter configured to sample at least one of a coil voltage potential and a coil current of a transmit coil. The processing core is configured to determine an expected reference Q-factor value responsive to the at least one of the sampled coil voltage potential and the sampled coil current, and compare the expected reference Q-factor value to a reference Q-factor value received from a wireless power receiver. The processing core is further configured to determine that a foreign object is detected proximate to the transmit coil responsive to a comparison of the expected Q-factor value to the reference Q-factor value received from the wireless power receiver.

20 Claims, 9 Drawing Sheets

(51) Int. Cl.
  *H02J 50/40* (2016.01)
  *G01R 27/26* (2006.01)
(58) Field of Classification Search
  USPC .......................................................... 307/104
  See application file for complete search history.

(56) References Cited

U.S. PATENT DOCUMENTS

| | | | |
|---|---|---|---|
| 2012/0139356 A1 | 6/2012 | Jung et al. | |
| 2012/0175967 A1 | 7/2012 | Dibben et al. | |
| 2012/0242163 A1 | 9/2012 | Jung et al. | |
| 2014/0077617 A1* | 3/2014 | Nakano | B60L 53/124 |
| | | | 307/104 |
| 2016/0043567 A1 | 2/2016 | Matsumoto et al. | |
| 2016/0121732 A1 | 5/2016 | Matsumoto et al. | |
| 2016/0164302 A1* | 6/2016 | Nakano | H02J 5/005 |
| | | | 307/104 |
| 2017/0005518 A1 | 1/2017 | Jung | |
| 2017/0093224 A1 | 3/2017 | Park et al. | |
| 2017/0117755 A1* | 4/2017 | Muratov | H02J 50/10 |
| 2017/0117756 A1* | 4/2017 | Muratov | H02J 7/025 |
| 2017/0149287 A1* | 5/2017 | Nakano | H02J 50/60 |
| 2017/0366048 A1* | 12/2017 | Watanabe | H02J 50/12 |
| 2018/0115197 A1* | 4/2018 | Li | H02J 50/80 |
| 2018/0131235 A1 | 5/2018 | Inoue et al. | |
| 2018/0131243 A1* | 5/2018 | Hamaguchi | H02J 50/80 |
| 2018/0219431 A1 | 8/2018 | Guillermo et al. | |
| 2019/0104569 A1 | 4/2019 | Moon et al. | |
| 2019/0131826 A1* | 5/2019 | Park | H02J 7/00034 |
| 2019/0296590 A1* | 9/2019 | Chae | H02J 50/12 |
| 2019/0312466 A1 | 10/2019 | Mynar et al. | |
| 2019/0312467 A1 | 10/2019 | Mynar et al. | |
| 2019/0319495 A1 | 10/2019 | Park | |
| 2019/0393732 A1 | 12/2019 | Oshima et al. | |
| 2020/0169123 A1* | 5/2020 | Mehas | H02J 7/025 |
| 2020/0274396 A1 | 8/2020 | Smith | |
| 2021/0203193 A1* | 7/2021 | Kim | H02J 50/60 |

OTHER PUBLICATIONS

International Search Report from International Application No. PCT/US2020/070635, dated Dec. 15, 2020, 5 pages.
International Written Opinion from International Application No. PCT/US2020/070635, dated Dec. 15, 2020, 11 pages.

* cited by examiner

FOREIGN OBJECT DETECTION IN WIRELESS CHARGING SYSTEMS AND RELATED SYSTEMS, METHODS, AND DEVICES

CROSS-REFERENCE TO RELATED APPLICATION

This application claims the benefit under 35 U.S.C. § 119(e) of U.S. Provisional Patent Application Ser. No. 62/984,722, filed Mar. 3, 2020, and titled "LOW POWER OBJECT DETECTION IN MULTI-COIL WIRELESS CHARGING SYSTEMS AND RELATED SYSTEMS, METHODS, AND DEVICES," the entire disclosure of which is hereby incorporated herein by reference.

TECHNICAL FIELD

The disclosure relates generally to wireless power transfer, and more specifically to low power object detection in multi-coil wireless power transmitters.

BACKGROUND

Wireless power transfer systems may transfer power from one electronic device to another electronic device. More specifically, a transmitter of a transmitting device may generate an electromagnetic field, and a receiver of a receiving device may extract power from the electromagnetic field.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
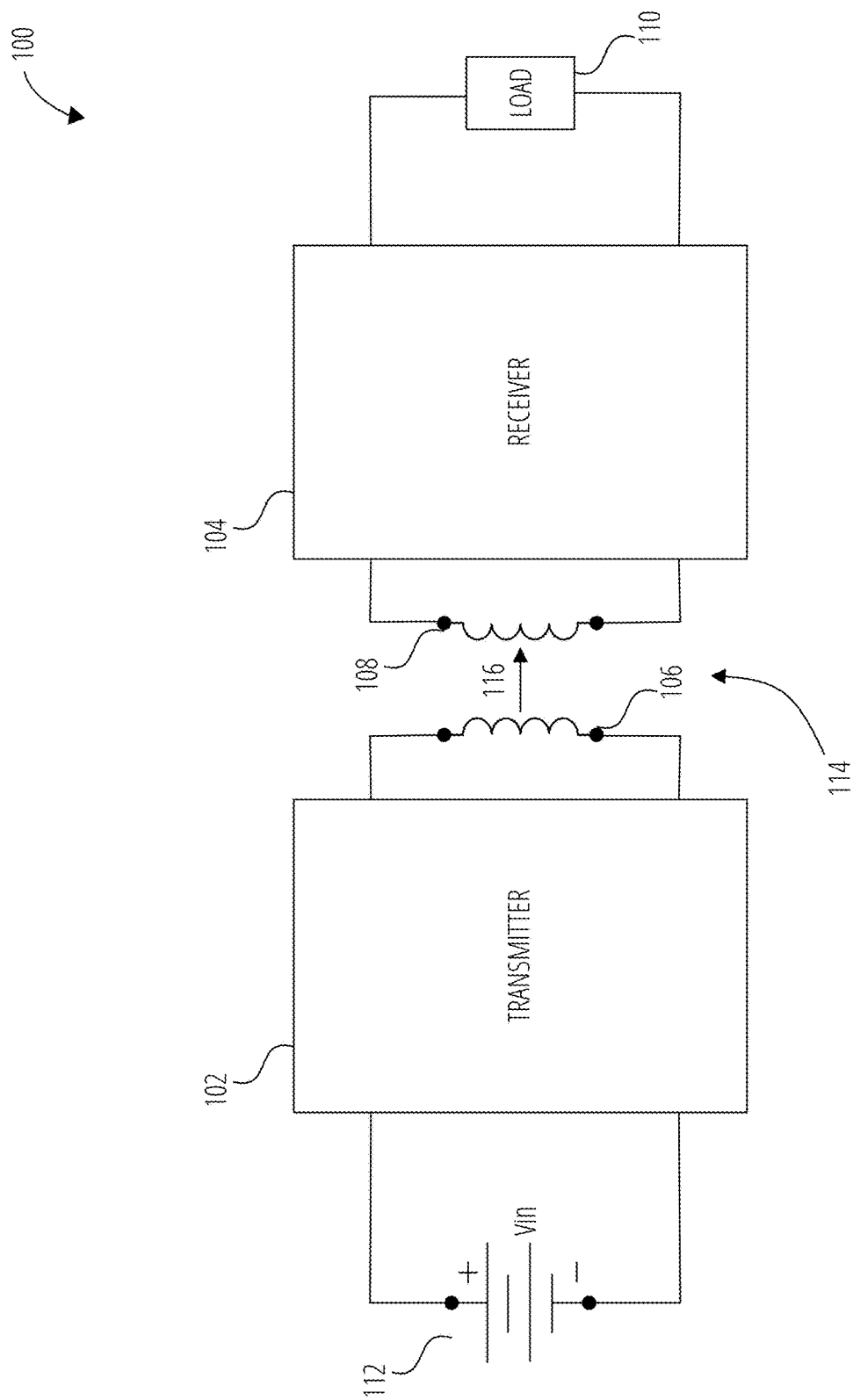
FIG. 1 is a block diagram of a wireless power system, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Wireless power transfer techniques are used to transfer power from one system to another in a wide range of applications. Qi is a widely adopted wireless charging standard and it has proliferated into consumer cellular telephone brands.

By way of example, a Qi wireless system includes a transmitter and a receiver. The transmitter controls the power transferred to the receiver based on feedback received from the receiver. The transmitter includes at least one coil with which the receiver coil is coupled in a wireless system. In a multi-coil transmitter design, there are multiple transmitter coils overlapping each other so that the receiver coil can be placed proximate to any of the transmitter coils. This provides spatial freedom for receiver placement and ensures power transfer even with mere approximate placement of the receiver coil proximate to the transmitter. In contrasts, single coil transmitters require that the receiver coil be properly aligned with the transmitter coil for power transfer.

One of the functions of the transmitter is to detect the presence of a receiver proximate to its coil. The Qi specification recommends using two methods for receiver detection, namely: (1) analog ping and (2) digital ping. These methods excite the tank circuit with a voltage potential known as a ping voltage, and measure either the current in analog ping or receiver communication in digital ping to detect the receiver. This is done periodically to check if a receiver is present. Both these methods, however, consume relatively large amounts of power, which could be an issue with battery powered transmitters. In addition, both of these methods fail to identify the presence of foreign objects, as differentiated from a receiver, proximate to the transmitter. If left undetected, a foreign object may cause the transmitter to treat the foreign object as part of a receiver, which may lead to incorrect power loss calibration and power being radiated to the foreign object, wasting power and potentially heating the foreign object.

Disclosed herein are wireless power transmitters that determine an expected reference Q-factor value that would be expected for a different type of wireless power transmitter than itself coupled to a given receiver, the expected reference Q-factor value determined from transmitter measurements and known parameters. By way of non-limiting example, the determined expected reference Q-factor value is determined as if the receiver had been placed on a Medium Power A1 (MP-A1) coil (e.g., as specified by the Wireless Power Consortium (WPC) Qi Medium Power Specification; Medium Power may be up to 15 Watts). The determined expected reference Q-factor value is compared to a reference Q-factor value received from the receiver calibrated to an MP-A1 transmitter. Calculation of the determined expected reference Q-factor value may be relatively complicated because the calculation depends on inductance and resistance values of the wireless power transmitter and the receiver. Also, the reflected impedance of the receiver on to the transmitter may depend on a coefficient of coupling between the wireless power transmitter and the receiver, which varies with spacer distance (z) of a receive coil of the receiver from a transmit coil of the wireless power transmitter as well as x-y alignment of the receive coil with respect to the transmit coil.

A Qi specification method for detecting foreign objects involves a receiver transmitting, to the transmitter during a calibration phase, a reference Q-factor value taken with an MP-A1 transmitter coil with a two millimeter spacer at 100 kHz. The transmitter uses the reference Q-factor value to detect if a foreign object is present. This Qi specified method of detecting foreign objects works well with the initially proposed transmitters that had transmitter characteristics similar to those of the MP-A1 transmitter. Newer transmitter topologies, however, have different characteristics from the MP-A1 transmitter, and therefore may not be capable of using the reference Q-factor value from the receiver, which is calibrated to an MP-A1 transmitter.

The Qi specification does not mention the use of determined reference Q-factor values for different types of transmitters. Rather, the Qi specification first specified that a reference Q-factor value for MP-A1 type transmitters would be used, and has not changed since its first specification. One way the Q-factor may be determined is by using several receivers having different Q-factors and fitting a curve across the Q-factor range with a transmitter and the reference Q-factor that would be sent. This curve-fitting method, however, works as a function of the receivers used, which may have different inductance and resistance values associated therewith. Since the Q-factor depends on the inductance and resistance values of the receivers, different receivers with the same Q-factor value but different inductance and resistance values will provide different reference Q-factor values when inductively coupled to a transmitter. As a result, this curve-fitting method may not be accurate.

The disclosed wireless power transmitters may account for variations in transmitter measurements due to alignment and distance variations between the transmit coil and the receive coil, as well as due to variations inherent to different types of receivers. The disclosed wireless power transmitters may also determine the expected reference Q-factor value regardless of whether the wireless power transmitters are MP-A1 type transmitters or other types of transmitters or whether inductance and resistance values of the transmitter match those of the receiver. As a result, wireless power transmitters disclosed herein may provide accurate computation of an expected reference Q-factor value for comparison with a provided (by the receiver) reference Q-factor value. Wireless power transmitters disclosed herein may also provide reliable detection of foreign objects in proximity to the transmitter in the presence of a receiver. These disclosed wireless power transmitters may use reference Q-factor values received from receivers, as per the Qi specification, to detect foreign objects regardless of whether the wireless power transmitters have characteristics that are different from those of MP-A1 type transmitters.

FIG. 1 is a block diagram of a wireless power system 100 including a transmitter 102 and a receiver 104, according to various embodiments of the disclosure. The transmitter 102 is configured to detect the presence of a foreign object in proximity thereto. Transmitter 102 is operably coupled to a voltage source 112 (e.g., a direct current (DC) voltage source such as a battery) configured to provide an input voltage Vin, and receiver 104 is coupled to a load 110. Wireless power system 100 further includes a plurality of transmit coils 106 (of which one is shown) and a receive coil 108, which may be used to transfer power 116 from transmitter 102 to receiver 104 (e.g., via inductive coupling). When transmit coils 106 are in proximity with receive coil 108 the transmit coils 106 and the receive coil 108 may be coupled coils 114 (e.g., at least one of the transmit coils 106 may be inductively coupled to the receive coil 108). No physical connection is required between the transmitter 102 and the receiver 104 to transfer power 116 from the transmitter 102 to the receiver 104. Rather, the power 116 is transferred using magnetic flux linkage. The transmitter 102 may control the power 116 transferred by controlling a voltage potential amplitude, frequency, phase, and/or duty cycle provided to the transmit coils 106.

Power transmission may be efficient when one of the transmit coils 106 is properly aligned with receive coil 108.

The transmitter 102 is configured to use one of the transmit coils 106 that has a strongest coupling with the receive coil 108 to transmit the power 116 to the receiver 104. The transmitter 102 may detect the presence of the receive coil 108 or some other conductive foreign object. Also, if the receive coil 108 is detected, the transmitter 102 may select one of the transmit coils 106 (e.g., the transmit coil with the strongest coupling to the receive coil 108) to transmit the power 116 to the receive coil 108, as is discussed in more detail below.

Figure 2:
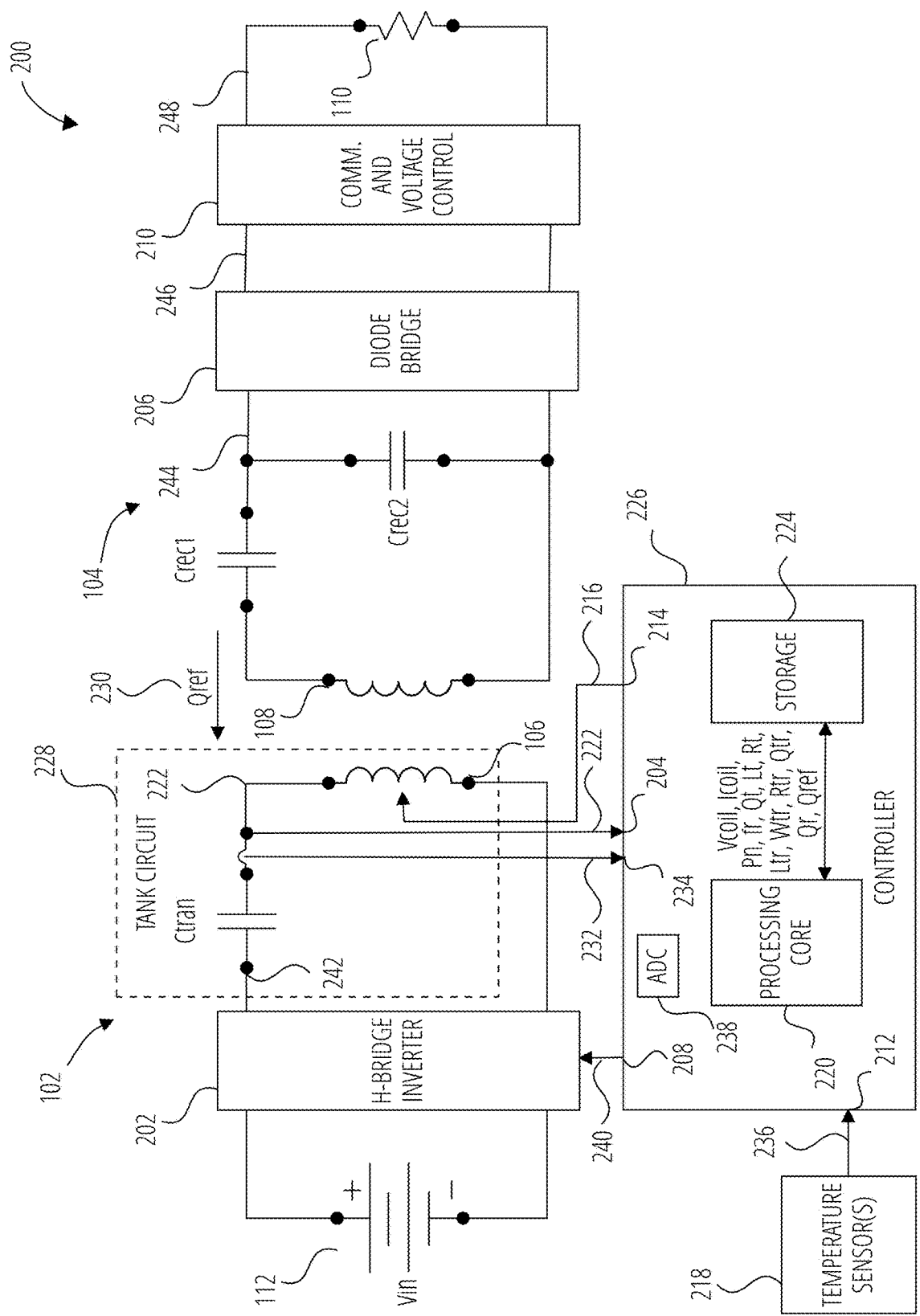
FIG. 2 is a block diagram of a wireless power system configured to detect the presence of a foreign object, according to some other embodiments.

FIG. 2 is a more detailed block diagram of the wireless power system 100 of FIG. 1. FIG. 2 illustrates the transmitter 102, the receiver 104, one of the transmit coils 106, the receive coil 108, the voltage source 112, and the load 110 illustrated in FIG. 1. As illustrated in FIG. 2, the transmitter 102 includes an H-bridge inverter 202, a tank circuit 228 (including the transmit coils 106 and a transmit capacitor Ctran electrically connected in series between the transmit coils 106 and the H-bridge inverter 202), one or more temperature sensor(s) 218, and a controller 226. The H-bridge inverter 202 is electrically connected between the voltage source 112 and the tank circuit 228.

The receiver 104 includes a resonant tank circuit (not shown) formed by the receive coil 108 and the receive capacitors Crec1 and Crec2 shown in FIG. 2. Accordingly, the receiver 104 may include receive capacitors Crec1 and Crec2, a diode bridge 206, and communication and voltage control circuitry 210. The receiver capacitor Crec1 may be electrically connected in series between the receive coil 108 and the diode bridge 206. The receiver capacitor Crec2 may be electrically coupled in parallel across the diode bridge 206. The diode bridge 206 may be configured to rectify an AC received signal 244 received from the transmitter 102 to provide a DC power signal 246. Accordingly, the output of the resonant tank circuit is passed through the diode bridge 206, which rectifies the AC received signal 244. The communication and voltage control circuitry 210 may be configured to receive the DC power signal 246 and produce a load voltage potential 248 to the load 110. By way of non-limiting example, the communication and voltage control circuitry 210 may include a buck converter or a low-dropout regulator (LDO), which provides a fixed load voltage potential 248 at the output load 110. The communication and voltage control circuitry 210 may be implemented in a controller (e.g., microcontroller), without limitation.

The controller 226 of the transmitter 102 includes a processing core 220 electrically connected to one or more data storage devices (storage 224). Various functions of the controller 226 are discussed herein. It will be appreciated that any of these functions may be performed by the processing core 220. The controller 226 also includes a coil voltage potential input 204 configured to receive a coil voltage potential 222 and a coil current input 234 configured to receive a coil current representation 232 indicating an electrical current of the transmit coils 106. The controller 226 further includes an analog to digital converter (ADC 238) configured to sample the coil current representation 232 at the coil current input 234, the coil voltage potential 222 at the coil voltage potential input 204, or both, and provide the sampled coil current representation 232 and/or the sampled coil current representation 232 to the processing core 220. Coil voltage potential 222 may be a scaled representation of the actual coil voltage potential, and/or the coil current representation 232 may be a scaled representation of the actual coil current.

The controller 226 further includes a coil select output 214 configured to provide one or more coil select signals 216 to the transmit coils 106. The coil select signals 216 are configured to selectively control which of the transmit coils 106 conducts an alternating current (AC) signal (AC signal 242) provided to the tank circuit 228 by the H-bridge inverter 202. The controller 226 also includes an AC control output 208 configured to provide one or more AC control signals 240 to the H-bridge inverter 202. The AC control signals 240 are configured to control the AC signal 242 applied to the tank circuit 228 by the H-bridge inverter 202. For example, with the H-bridge inverter 202 electrically connected between the voltage source 112 and the tank circuit 228, the controller 226 may selectively apply the AC control signals 240 to convert the input voltage potential Vin (e.g., a DC voltage potential) provided by the voltage source 112 to a square wave AC signal 242 (e.g., by periodically inverting the input voltage Vin).

The controller 226 is configured to calculate an expected reference Q-factor value Qr using measurements taken at the transmitter 102 (e.g., the coil current representation 232 and or the coil voltage potential input 204), known parameters, and a reference Q-factor value 230 (also referred to as "Qref") communicated by the receiver 104 to the transmitter 102. The reference Q-factor value 230 received from the receiver 104 may be a reference Q-factor value for the receiver placed in proximity to an MP-A1 type transmit coil, as per the Qi specification. The receiver 104 may communicate the reference Q-factor value 230 to the transmitter 102 via a wired communication medium (e.g., Ethernet, without limitation) or a wireless communication medium (e.g., Bluetooth, Wi-Fi, or communication over wireless power, without limitation).

The controller 226 samples the coil voltage potential 222 and the coil current representation 232 of the transmit coils 106. The controller 226 also drives the AC control signals 240 with either a fixed or a variable frequency depending on the topology of the transmitter 102. The controller 226 is configured to drive the H-bridge inverter 202 using the AC control signals 240 to deliver the AC signal 242 to the tank circuit 228 for a certain number of cycles of the AC signal 242 and then turn off the AC signal 242. The AC control signals 240 may be pulse width modulation signals generated by the controller 226. After the AC signal 242 is turned off, the tank circuit 228 may resonate at its resonant frequency depending on inductance and capacitance values of the transmit coils 106, the receive coil 108, the transmit capacitor Ctran, and the receive capacitors Crec1 and Crec2. The rate of decay of the coil voltage potential 222 depends on the resistance in the transmitter 102. The presence of the receiver 104 changes the resonant frequency of the tank circuit 228 as well as the decay rate of the coil voltage potential 222. A higher resistance in the transmitter 102 lowers the Q-factor value of the transmitter 102, while a higher inductance of the transmit coils 106 increases the Q-factor value of the transmitter 102. While the transmit coils 106 are inductively coupled to the receive coil 108, the inductance of the receive coil 108 manifests at the transmitter 102 as a positive inductance value that is added to the inductance of the transmit coils 106 (i.e., the effective inductance value of the transmit coils 106 increases while coupled to the receive coil 108). The resistance of the receiver 104 also is added to the resistance of the transmitter 102 from the perspective of the transmitter 102 (i.e., the effective resistance of the transmitter 102 increases while coupled to the receive coil 108 responsive to the resistance of the receiver 104). Even if the Q-factor value of the tank circuit 228, which may be proportional to the ratio between the inductance of the transmit coils 106 to the resistance of the transmitter 102, is monitored, it may, however, be difficult to judge whether a change in the Q-factor value of the tank circuit 228 is due to the coupling with the receiver 104 or coupling with a foreign object.

The presence of a foreign object along with the presence of the receiver 104 may be determined by the controller 226 by separating out the values of inductance and resistance determined for the transmit coils 106 both with the transmit coils 106 coupled to the receive coil 108 (Ltr and Rtr, respectively) and without the transmit coils 106 coupled to the receive coil 108 (Lt and Rt, respectively). At resonance, the capacitive impedance is equal to the inductive impedance in a series inductor-capacitor (LC) circuit. If one of these impedances is measured along with the resonant frequency (fr without the receiver 104 or Wtr with the receiver 104), the value of inductance (Lt without the receiver 104 or Ltr with the receiver 104) can be computed. Similarly, if the Q-factor value of the tank circuit 228 (Qt without the receiver 104 or Qtr with the receiver 104) is computed (e.g., based on peaks Pn identified in samples Vcoil of the coil voltage potential 222 and/or samples Icoil of the coil current representation 232), knowing the inductance (Lt or Ltr) and the resonant frequency (fr or Wtr) of the tank circuit 228, the resistance (Rt without the receiver 104 or Rtr with the receiver 104) of the transmitter 102 can be determined. These measurements may be repeated once for the transmitter 102 without any receiver 104, and once each time the receiver 104 is placed in proximity to (e.g., on) the transmitter 102. The first measurement, i.e. the measurement for the transmitter 102 without any receiver 104 in proximity, allows determination of the inductance Lt of the transmit coils 106 and the resistance Rt of the tank circuit 228. A second set of readings are taken when the receiver 104 is placed in proximity to the transmitter 102, thus providing an increased effective inductance Ltr and an increased effective resistance Rtr. These four readings along with the resonant frequencies fr, Wtr may be used to determine an expected reference Q-factor value Qr that the transmitter 102 would expect to experience if it were an MP-A1 type coil with a 2 mm spacer.

Figure 3:
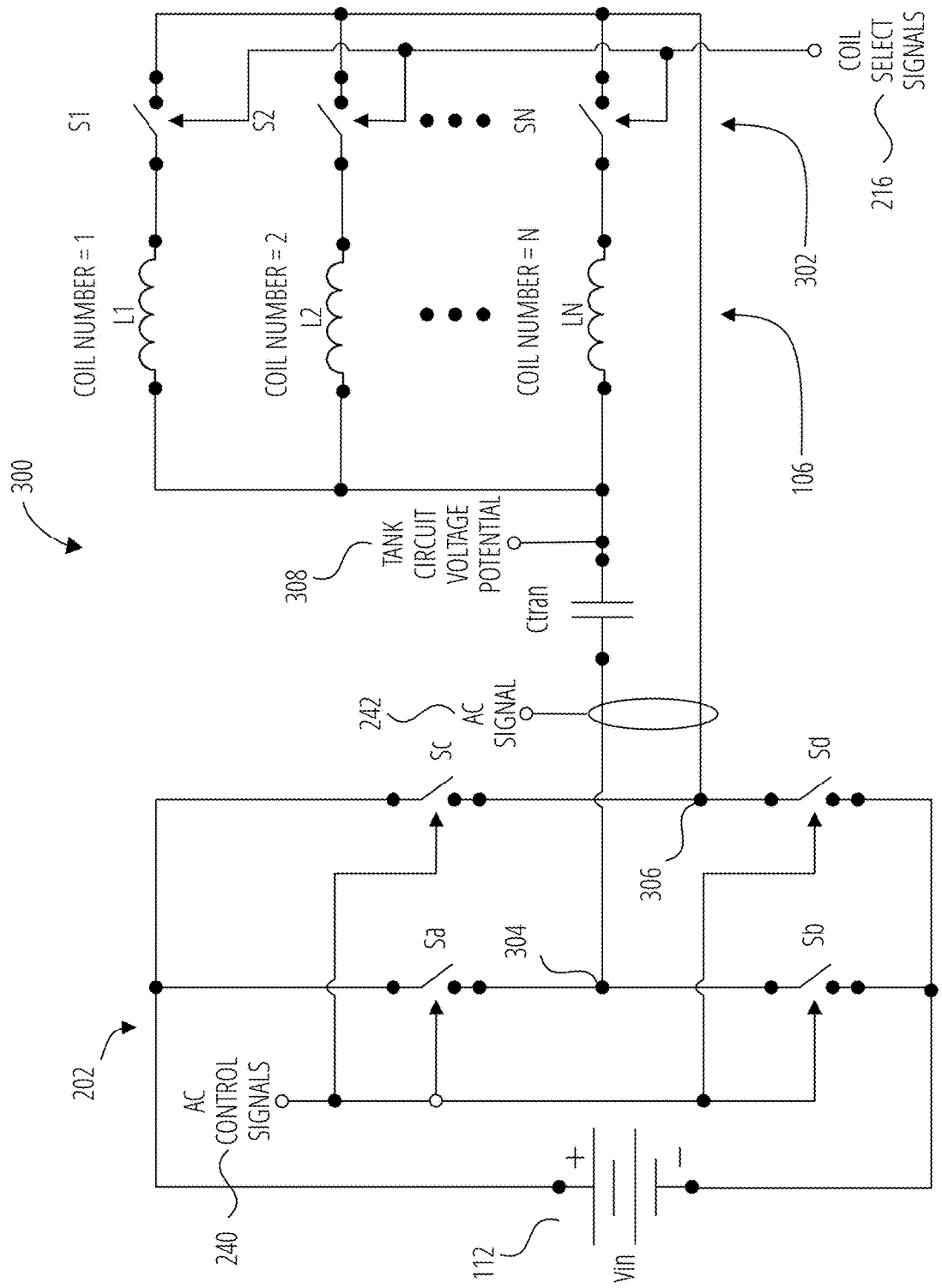
FIG. 3 is a schematic illustration of a segment of a wireless power transmitter of FIG. 1 and FIG. 2.

Simulation of the wireless power system 200 (e.g., in a three transmit coil design, L1, L2, and LN where N=3, as illustrated in FIG. 3, without limitation) reveals that the determined expected reference Q-factor values Qr computed by the controller 226 match closely with the reference Q-factor value 230 (also illustrated as "Qref") provided by the receiver 104. The controller 226 may be used with various transmitter designs where a variety of inductance and resistance values could be used. Inductance and resistance values may vary from transmitter to transmitter due to differences in the transmit coils 106 or switches Sa, Sb, Sc, and Sd (e.g., MOSFETs) used in the H-bridge inverter 202 (see FIG. 3). The controller 226 enables reliable detection even where any of various different transmitter topologies are used with any of a variety of receivers.

In some embodiments, the controller 226 is configured to perform a data collection method 400 described below in relation to FIG. 4, a data processing method 500 described below in relation to FIG. 5, an object detection method 600 described below in relation to FIG. 6, or all so as to detect the presence of foreign objects proximate to the transmitter 102.

Inductance of the transmit coils 106 may be affected by temperature. Accordingly, the controller 226 includes a temperature input 212 configured to receive a temperature signal 236 from the temperature sensor(s) 218. The temperature signal 236 is correlated to temperature of the transmitter 102 (e.g., of the transmit coils 106). Since the inductance of the transmit coils 106 may be influenced by temperature, the controller 226 may take into consideration these fluctuations during operation of the transmitter 102.

FIG. 3 is a schematic illustration of a segment 300 of the wireless power transmitter 102 of FIG. 1 and FIG. 2. Referring to FIG. 2 and FIG. 3 together, the segment 300 includes the voltage source 112, the H-bridge inverter 202, the transmit capacitor Ctran, and the transmit coils 106 (L1, L2, . . . , LN) discussed above. An input of the H-bridge inverter 202 is illustrated in FIG. 3 as being electrically connected to the voltage source 112. It should be noted, however, that in some embodiments the input of the H-bridge inverter 202 may instead be electrically connected to an output of a converter (not shown) (e.g., a DC to DC converter such as a four-switch buck boost converter (FSBBC), without limitation). The segment 300 also illustrates coil switches 302 (coil switches S1, S2, . . . , SN) each electrically connected serially with a respective transmit coil 106. The number N of the transmit coils 106 and the coil switches 302 may be any number (e.g., one, two, three, four, five, ten, twenty, without limitation). The coil switches 302 are electrically controllable to enable the controller 226 to selectively open and close the coil switches 302 via the coil select signals 216. By closing one of the coil switches 302 associated with one of the transmit coils 106, the associated one of the transmit coils 106 is effectively placed in the tank circuit 228 (FIG. 2). In some embodiments, only one of the transmit coils 106 is selected at a time (e.g., by closing the associated one of the coil switches 302). In some embodiments the coil switches 302 may be transistors (e.g., back-to-back MOSFETs for conducting bidirectional AC current in the tank circuit) having gates electrically connected to the coil select signals 216. Accordingly, the coil select signals 216 provided by the controller 226 may include a bus of signals configured to individually control the coil switches 302.

The H-bridge inverter 202 also includes several electrically controllable switches (switches Sa, Sb, Sc, and Sd). Switches Sa, Sb, Sc, and Sd are electrically controllable via the AC control signals 240 from the controller 226 to generate the AC signal 242 across a first node 304 and a second node 306 of the H-bridge inverter 202. By way of non-limiting example, the switches Sa, Sb, Sc, and Sd may be transistors having the AC control signals 240 electrically connected to their gates. In some embodiments switches Sa, Sb, Sc, and Sd may be MOSFET transistors driven by MOSFET drivers. The controller 226 may disable or turn off the AC signal 242 by deasserting the AC control signals 240 at each of the switches Sa, Sb, Sc, and Sd (i.e., providing a voltage potential configured to open the switch). With the AC signal 242 disabled the first node 304 and the second node 306 may be in an electrically floating state. The controller 226 may activate the AC signal 242 by alternating between: closing switches Sa and Sd while opening switches Sc and Sb; and opening switches Sa and Sd while closing switches Sc and Sb. Switches Sa, Sb, Sc, and Sd may be closed by asserting the respective AC control signals 240. The AC control signals 240 provided by the controller 226 may include a bus of signals configured to control the switches Sa, Sb, Sc, and Sd. In some embodiments a single signal of the AC control signals 240 may control switches Sa and Sd and another signal may control switches Sc and Sd. In some embodiments the AC control signals 240 may include four separate signals to control the switches Sa, Sb, Sc, and Sd separately. In some embodiments MOSFET driver inputs (not shown) of MOSFET drivers (not shown) electrically coupled between the controller 226 (FIG. 2) and the switches Sa, Sb, Sc, and Sd are controlled by the AC control signals 240, which may be provided by pulse-width modulation (PWM) outputs from PWM output pins of the controller 226, without limitation. With switches Sa and Sd closed and switches Sb and Sc open the voltage potential across first node 304 and second node 306 may be Vin, resulting in a positive half cycle of the AC signal 242. With switches Sa and Sd open and switches Sb and Sc closed the voltage potential across first node 304 and second node 306 may be −Vin, resulting in a negative half cycle of the AC signal 242. Accordingly, with alternation between these two states a square wave AC signal 242 across first node 304 and second node 306 results. By way of non-limiting example, a frequency of operation (i.e., a switching frequency, which in turn amounts to a frequency of the AC signal 242) may be set to substantially 125 kHz. As a result, the H-bridge inverter 202 applies the AC signal 242 across the tank circuit 228 (FIG. 2) formed by a capacitance of the transmit capacitor and an inductance of the transmit coils 106.

Figure 5:
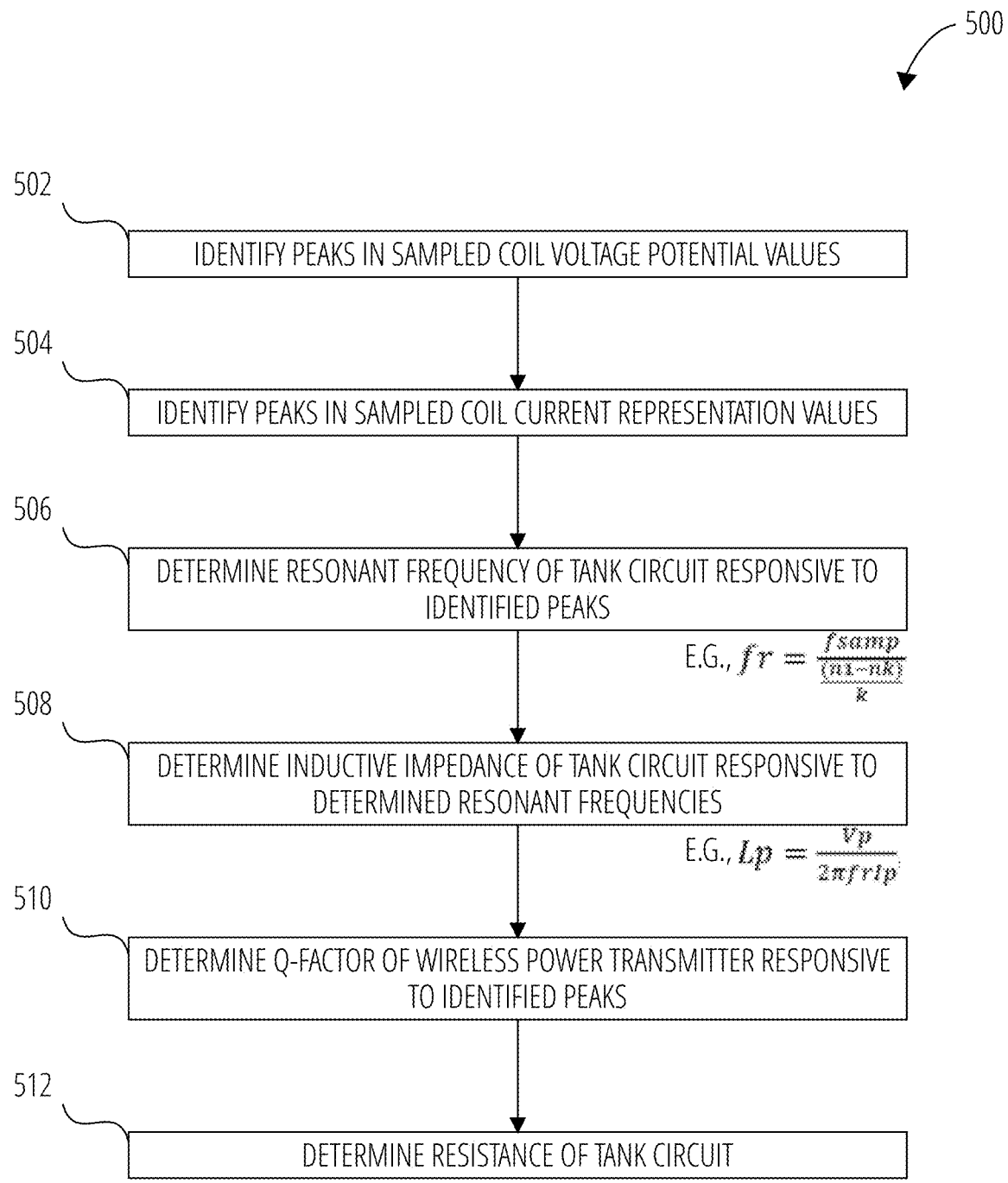
FIG. 5 is a flowchart illustrating a data processing method for an object detection method of a wireless power transmitter (e.g., the transmitter of FIG. 2), according to some embodiments.
Figure 6:
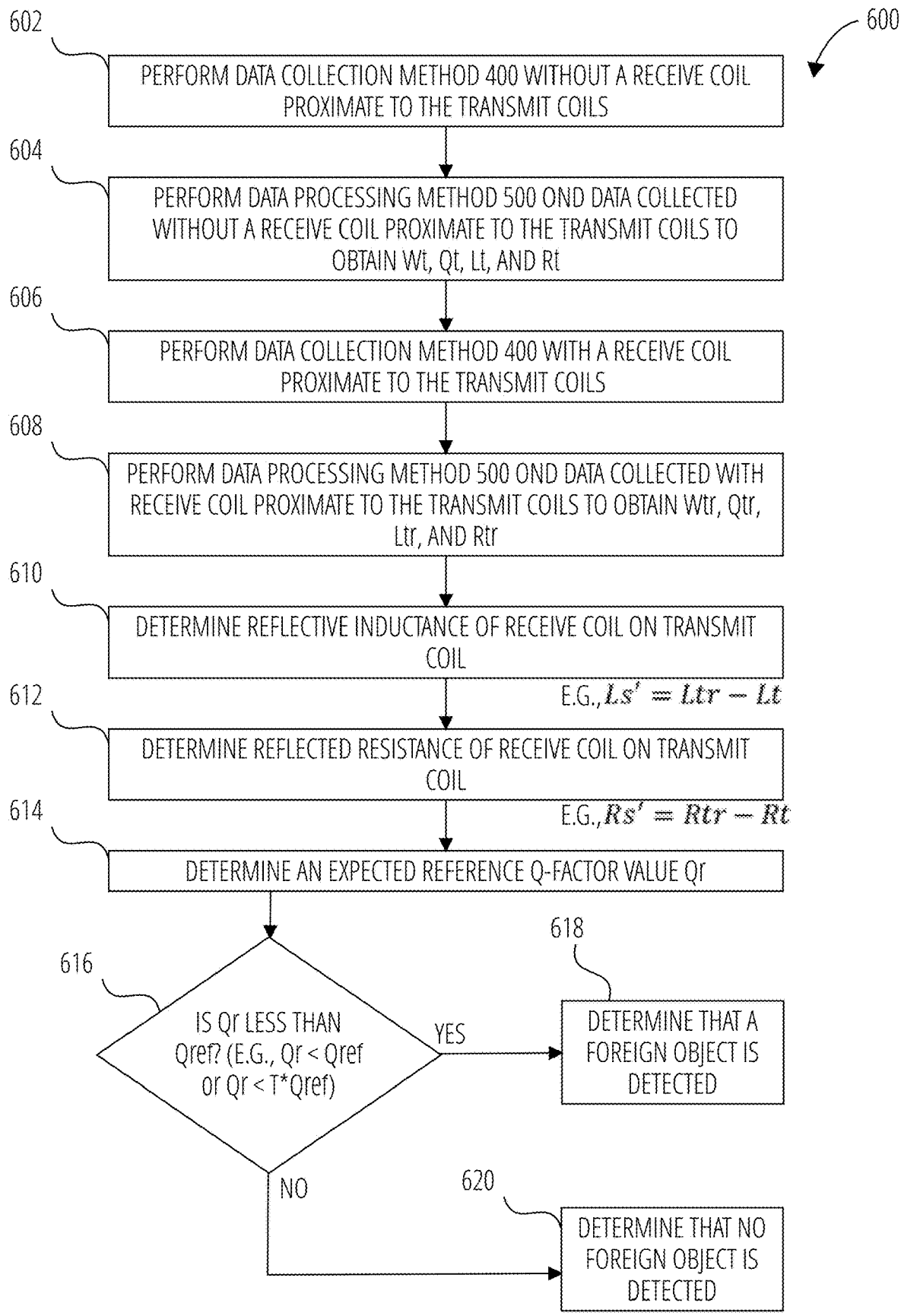
FIG. 6 is a flowchart illustrating an object detection method of a wireless power transmitter (e.g., the transmitter of FIG. 2), according to some embodiments.

The controller 226 is configured to periodically control the wireless power transmitter 102 to perform an object detection operation (e.g., operations 606-620 of an object detection method 600 of FIG. 6). In time periods between object detection operations the wireless power transmitter 102 may operate in a low power state (e.g., a sleep mode or a standby mode) to conserve power. The object detection operation includes a data collection method (e.g., the data collection method 400 of FIG. 4) and a data processing method (e.g., the data processing method 500 of FIG. 5).

In the data collection method the controller 226 is configured to set a coil number equal to a first number. Each transmit coil of the transmit coils 106 is associated with a particular number from the first number to a last number, as illustrated in FIG. 3. For example, transmit coil L1 is associated with coil number=1, transmit coil L2 is associated with coil number=2, and transmit coil LN is associated with coil number=N. Similarly, each coil switch of the coil switches 302 is associated with a number from the first number to the last number. For example, coil switch S1 is associated with coil number=1, coil switch S2 is associated with coil number=2, and coil switch SN is associated with coil number=N.

In the data collection method the controller 226 may also close one of the coil switches 302 associated with the coil number to electrically connect the one of the transmit coils 106 associated with the coil number to the H-bridge inverter 202. The controller 226 may control the H-bridge inverter 202 to provide the AC signal 242 to the tank circuit 228. After application of the AC signal 242 to the tank circuit 228, which may charge the tank circuit 228, the controller 226 may sample the coil voltage potential 222 and the coil current representation 232. The controller 226 may then increment the coil number and repeat the data collection method for each one of the coils (i.e., unless the incremented coil number is greater than the last number, which in the case of FIG. 3 is coil number=N). More detail regarding the data collection method, the data processing method, and the object detection method is discussed below with reference to FIG. 4, FIG. 5, and FIG. 6, respectively.

The controller 226 may also be configured to perform calibrations of the transmitter 102. As previously mentioned, the inductance of the transmit coils 106 may fluctuate responsive to temperature fluctuations. As a result, the controller 226 may take into consideration these fluctuations due to temperature fluctuations during the object detection operation. For example, the controller 226 may be configured to adjust the value of a threshold minimum Q-factor value, an expected uncoupled resonant frequency value, and a threshold minimum resonant frequency value used during a data processing method (e.g., the data processing method 500 of FIG. 5) and an object detection method (e.g., the object detection method 600 of FIG. 6) based on the temperature signal 236. Also, in some embodiments the transmit coils 106 may experience different temperatures from each other. As a result, the controller 226 may be configured to adjust measured Q-factors and resonant frequencies for the coils based on the temperature differences to prevent temperature differences between the transmit coils 106 from influencing object detection and transmit coil selection.

Furthermore, inductance values of the transmit coils 106 may not all be the same. By way of non-limiting example, the inductance values of the transmit coils 106 may vary by about twenty percent (20%) due to manufacturing tolerances. Accordingly, the controller 226 may be configured to perform a calibration to normalize differences between the inductance values of the transmit coils 106 to prevent differences between inductance values of the transmit coils 106 from influencing object detection and transmit coil selection.

Figure 4:
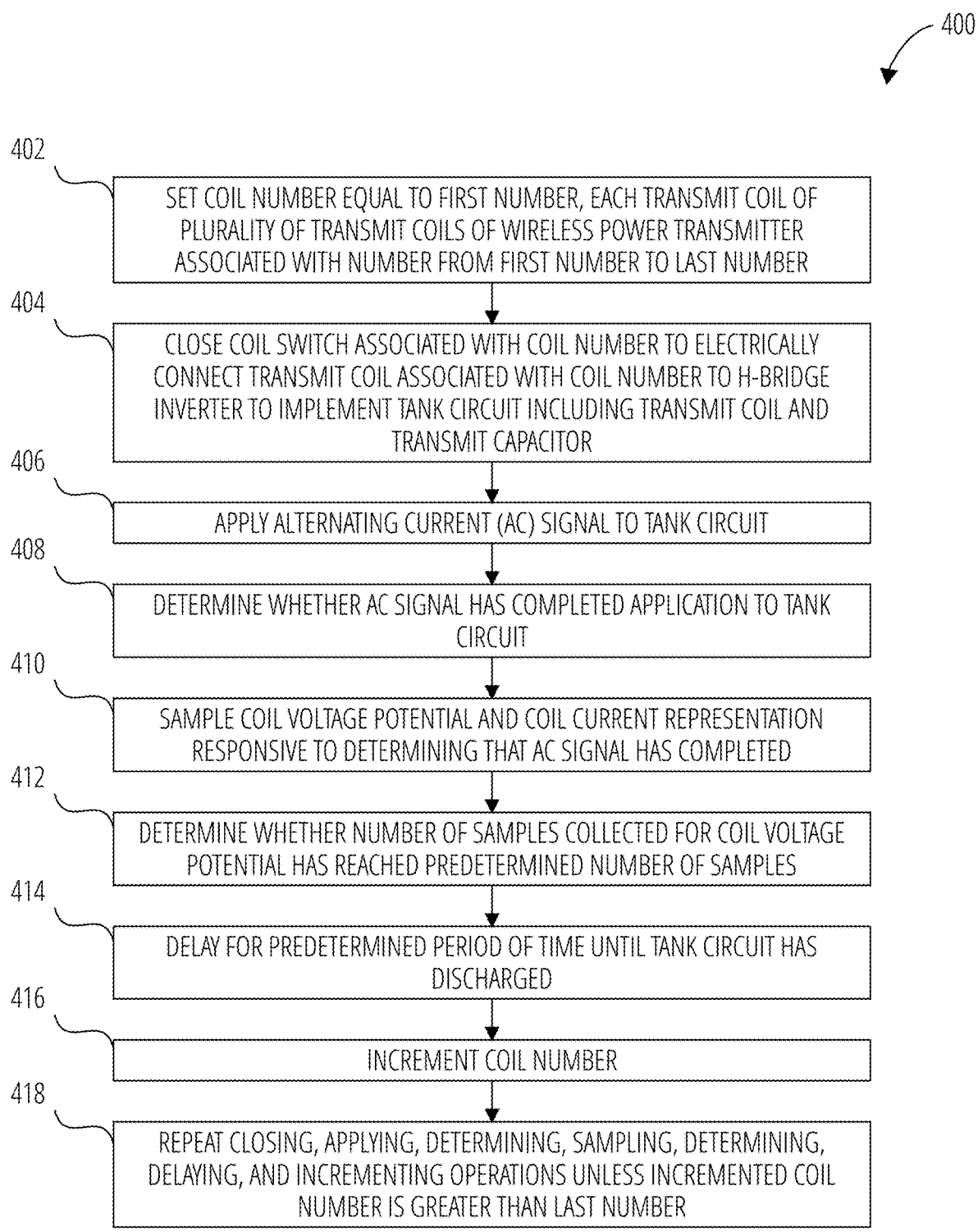
FIG. 4 is a flowchart illustrating a data collection method for an object detection method of a wireless power transmitter (e.g., a transmitter of FIG. 2), according to some embodiments.

FIG. 4 is a flowchart illustrating the data collection method 400 for an object detection method of a wireless power transmitter (e.g., the transmitter 102 of FIG. 2), according to some embodiments. In operation 402, data collection method 400 sets a coil number equal to a first number. Each transmit coil of a plurality of transmit coils of the wireless power transmitter is associated with a particular number from the first number to a last number. In operation 404, data collection method 400 closes a coil switch associated with the coil number to electrically connect a transmit coil associated with the coil number to an H-bridge inverter to implement a tank circuit including the transmit coil and a transmit capacitor. In operation 406, data collection method 400 applies an AC signal to the tank circuit. In some embodiments applying an AC signal to the tank circuit includes enabling one or more AC control signals configured to control the AC signal. In some embodiments enabling one or more AC control signals includes enabling one or more pulse-width modulation signals (e.g., the AC control signals 240 of FIG. 2) configured to control an H-bridge inverter operably coupled to a DC voltage source (e.g., voltage source 112 of FIG. 2) to generate the AC signal 242.

In operation 408, data collection method 400 determines whether the AC signal has completed application to the tank circuit. By way of non-limiting example it may be determined that the AC signal has completed operation responsive to a detection that a predetermined period of time has passed since initialization of the AC signal.

In operation 410, data collection method 400 samples (e.g., using an analog to digital converter (ADC), without limitation) a coil voltage potential across a transmit coil and a coil current representation of the transmit coil responsive to determining that the AC signal has completed. By way of non-limiting example, the coil voltage potential and the coil current representation may be sampled independently and concurrently using two independent ADC channels for each coil. Also by way of non-limiting example, the coil voltage potential and the coil current representation may be sampled at a very high rate (e.g., 1.6 MHz, without limitation). A very high sample rate ensures that several samples are available in each resonant frequency of 78 kHz. Assuming that the sample rate is 1.6 MHz at a resonant frequency of 78 kHz, twenty samples are available every cycle of the coil voltage potential and the coil current representation. In operation 412, data collection method 400 determines whether a number of samples collected for the coil voltage potential has reached a predetermined number of samples (e.g., 400 samples, without limitation). Assuming that the predetermined number of samples is 400, about twenty cycles of the coil voltage potential and the coil current representation may be captured.

In operation 414, data collection method 400 delays for a predetermined period of time (e.g., corresponding to a predetermined number of peaks of the coil voltage potential) until the tank circuit has discharged. By way of non-limiting example, the sampled coil voltage potential and coil current representation may be processed immediately after the data collection in place of delay (operation 414) or can be processed (e.g., using the data processing method 500 of FIG. 5) together with sampled coil voltage potential and coil current from other coils.

In operation 416, data collection method 400 increments the coil number. In operation 418, data collection method 400 repeats the closing (operation 404), applying (operation 406), determining (operation 408), sampling (operation 410), determining (operation 412), delaying (operation 414), and incrementing (operation 416) operations unless the incremented coil number is greater than the last number.

FIG. 5 is a flowchart illustrating the data processing method 500 for an object detection method of a wireless power transmitter (e.g., the transmitter 102 of FIG. 2), according to some embodiments. In some embodiments the data processing method 500 may start after the data collection method 400 is performed for all of the transmit coils of the transmitter. In some embodiments, the data processing method 500 may start during the data collection method 400 (e.g., during delays corresponding to operation 414 of the data collection method 400, without limitation). The sampled coil voltage potential values sampled in operation 410 of the data collection method 400 for each of the transmit coils represent an exponentially decaying sinusoid with a resonant frequency fr. At operation 502 the data processing method 500 identifies peaks Pn in the sampled coil voltage potential values. For example, the controller (e.g., controller 226) may look for a peak value by comparing previous and next sample values in a three-point filter arrangement. At the peak, the previous and next sample values are lower than the present value. The positive peaks and/or the negative peaks may be identified and stored in an array (e.g., in storage 224).

The sampled coil current representation values sampled in operation 410 of the data collection method 400 for each of the transmit coils represent an exponentially decaying sinusoid with a resonant frequency fr. Shapes of waveforms associated with the sampled coil current representation values may be similar to shapes of waveforms associated with the coil voltage potential sample values except that waveforms associated with the coil current representation sample values are approximately 90 degrees out of phase with waveforms associated with the sample coil voltage potential values. At operation 504 the data processing method 500 identifies peaks (e.g., positive peaks and/or negative peaks) in the sampled coil current representation values for each transmit coil.

At operation 506, the data processing method 500 determines a resonant frequency of the tank circuit responsive to the identified peaks identified in operation 502 and/or operation 504. The peaks identified in either the coil voltage potentials (e.g., in operation 502) or the coil current representations (e.g., in operation 504) may be used to determine the resonant frequency fr associated with each transmit coil. In embodiments where the sampling periods of the coil voltage potential and the coil current representation are fixed, identification of sample numbers corresponding to peaks may be used to determine the resonant frequency fr. Determined values of the resonant frequency may be accurate if the time (or sample number) between the peaks is measured as an average rather than just between two consecutive peaks. If the sampling frequency is increased to be much higher than the resonant frequency fr, two consecutive peaks may be used to determine the resonant frequency fr. The resonant frequency fr may be computed as:

$$fr = \frac{fsamp}{\frac{(n1-nk)}{k}},$$

where n1 is the sample number of the $1^{st}$ peak, nk is the sample number of the kth peak, and fsamp is an analog to digital converter sampling frequency.

At operation 508, the data processing method 500 determines inductive impedance of the tank circuit. At resonance, the inductive impedance of the tank circuit (e.g., tank circuit 228 of FIG. 2) is equal and opposite to the capacitive impedance. The resonant frequency fr depends on the values of the inductance of the transmit coil and the transmit capacitor Ctran (FIG. 2), while the coil current depends on either the inductive or the capacitive impedance. Since the reactive impedance is significantly higher than the resistance in the tank circuit, the resistance may be neglected for simplicity and the inductance in the tank circuit may be computed using the following equations:

$$Zp = \frac{Vp}{Ip}, \text{ and}$$

$$Zp = Rp + jXp = \frac{Vp}{Ip}.$$

Since:

$$Xp >> Rp,$$

it follows that:

$$Zp = jXp,$$

$$Wr = 2\pi fr,$$

$$Xp = 2\pi frLp = \frac{Vp}{Ip}, \text{ and}$$

$$Lp = \frac{Vp}{2\pi frIp},$$

where Zp is the total impedance of the tank circuit, Xp is the reactive impedance of the tank circuit, fr is the resonant frequency of the tank circuit, Lp is the inductive impedance of the tank circuit, Rp is the resistance of the tank circuit, $v_p$ is a peak value of the coil voltage potential, $i_p$ is a peak value of the coil current representation, and j is the square root of minus one.

The peak values $v_p$, $i_p$ of the respective coil voltage potential and the coil current representation correspond to the same sampling times. For instance, if a second peak $v_p$ of the coil voltage potential is used for computation, the second coil current representation peak $i_p$ should also be used. Since the value of inductance is in micro-Henries, it may be useful to compute Xp rather than Lp for computational accuracy. More specifically, computing Xp rather than Lp may be easier because it is a ratio of peak voltage $v_p$ to peak current $i_p$, while computing Lp directly may require computation of Xp and also frequency measurement because Lp=Xp/(2*π*fr). As a result, computing Lp directly would involve an extra division computation as compared to computing Xp, which would take additional time to compute. As a result, computing Xp may be faster than computing Lp.

At operation 510, the data processing method 500 determines a Q-factor Q of the wireless power transmitter for each of the transmit coils responsive to the identified peaks Pn (e.g., identified at operation 502 and/or operation 504). The value of the Q-factor Q may be determined from the peak values of the coil voltage potential and/or the coil current using the following equation:

$$Q = \frac{1}{2}\sqrt{1+\left(\frac{2\pi}{\ln\left(\frac{P_N}{P_{N+1}}\right)}\right)^2},$$

where $P_N$ is the Nth peak value and $P_{N+1}$ is the N+1th peak value. The Q-factor value Q may be determined using a single computation or using an average of Q-factors computed over several cycles of the coil voltage potential and/or the coil current. Use of an average may mask computational sensitivity, and is therefore preferred over Q-factor computation using a single computation.

At operation 512, the data processing method 500 determines a resistance Rp of the tank circuit. The resistance Rp of the tank circuit may be estimated by dividing the determined inductive impedance Xp by the Q-factor Q.

The Q-factor values Q as well as the resonant frequency fr measurements are completed for each of the coils and provided to storage (e.g., storage 224 of FIG. 2) where they are stored (e.g., as an array, without limitation).

FIG. 6 is a flowchart illustrating an object detection method 600 of a wireless power transmitter (e.g., the transmitter 102 of FIG. 2), according to some embodiments. At operation 602, the object detection method 600 includes performing the data collection method 400 without a receive coil proximate to the transmit coils. At operation 604, the object detection method 600 includes performing the data processing method 500 on data collected at operation 602 without a receive coil proximate to the transmit coils to obtain a transmitter only resonant frequency Wt, a transmitter only Q-factor value Qt, a transmitter only inductive impedance of the tank circuit Lt, and a transmitter only resistance of the tank circuit Rt. The transmitter only resonant frequency Wt may be given by Wt=2π*ft, where ft is the resonant frequency of the tank circuit fr without the receiver proximate to the transmit coils. The transmitter only Q-factor value Qt is the Q-factor value Q of the tank circuit without the receiver proximate to the transmit coils. Also, the transmitter only inductive impedance of the tank circuit Lt is the inductive impedance Lp of the tank circuit without the receiver proximate to the transmit coils. Further, the transmitter only resistance of the tank circuit Rt is the resistance Rp of the tank circuit without the receiver proximate to the transmit coils.

Operation 602, which involves performing the data collection method 400 (FIG. 4), is performed at least once with no receiver positioned proximate to the transmitter. Based on the sampled coil voltage potential values and coil current representation values obtained during the data collection method 400 with no receiver positioned proximate to the transmitter, operation 604 is performed on the data collected in operation 602. For each transmit coil a transmitter only inductance value Lt (e.g., an inductive impedance used as the transmitter inductance is determined in operation 508), a transmitter only Q-factor Qt (e.g., in operation 510), a transmitter only resonant frequency Wt of the tank circuit (e.g., in operation 506), and a transmitter only resistance Rt of the tank circuit are determined (e.g., in operation 512). These measurements and computations (e.g., operations 602 and 604) for the transmitter without a receiver in proximity may be performed in the factory during a calibration phase and the values may be stored in storage (e.g., storage 224 of FIG. 2) for future use.

Another set of readings (measurements and determined values) are taken (e.g., performance of the data collection method 400 (FIG. 4) and the data processing method 500 (FIG. 5)) when a receiver is positioned in proximity to the transmitter (e.g., placed on the transmitter). This may be done to check whether or not a foreign object is in proximity to the receiver before transmitting power to the receiver (i.e., proceeding to a power-transfer phase). The data collection method 400 and the data processing method 500 may be performed periodically and/or each time a receiver is placed in proximity to the transmitter. In such instances, a combined transmitter-receiver inductance Ltr, a combined transmitter-receiver Q-factor value Qtr, a combined transmitter-receiver resonant frequency Wtr, and a combined resistance Rtr (an inductive impedance Xtr of the tank circuit while inductively coupled to the receive coil divided by the combined transmitter-receiver Q-factor value Qtr) may be determined.

For example, at operation 606, the object detection method 600 includes performing data collection method 400 with a receive coil proximate to the transmit coils. At operation 608, the object detection method 600 includes performing the data processing method 500 on data collected with the receive coil proximate to the transmit coils to obtain a combined transmitter-receiver resonant frequency Wtr, a combined transmitter-receiver Q-factor value Qtr, a combined transmitter-receiver inductance Ltr, and a combined transmitter-receiver resistance Rtr of the tank circuit. The combined transmitter-receiver resonant frequency Wtr may be given by Wtr=$2\pi$*ftr, where ftr is the resonant frequency of the tank circuit fr with the receiver proximate to the transmit coils. The combined transmitter-receiver Q-factor value Qtr is the Q-factor value Q of the tank circuit with the receiver proximate to the transmit coils. Also, the combined transmitter-receiver inductive impedance of the tank circuit Ltr is the inductive impedance Lp of the tank circuit with the receiver proximate to the transmit coils. Further, the combined transmitter-receiver resistance of the tank circuit Rtr is the resistance Rp of the tank circuit with the receiver proximate to the transmit coils.

At operation 610, object detection method 600 determines a reflected inductance Ls' of the receive coil on the transmit coil. For example, the reflected inductance of the receive coil on the transmit coil may be determined as:

$Ls'=Ltr-Lt.$

At operation 612, object detection method 600 determines a reflected resistance Rs' of the receive coil on the transmit coil. For example, the reflected resistance Rs' of the receive coil on the transmit coil may be determined as:

$Rs'=Rtr-Rt.$

The transmitter receives a reference Q-factor value Qref from the receiver, which is computed at 100 kHz with the receiver coupled at a distance d1 of 2 mm to a reference MP-A1 transmitter coil. The reference MP-A1 transmitter coil may have an inductance L1 of 24 pH and a resistance R1 of 0.1Ω. The values L1 and R1 are the values for the MP-A1 transmitter coil alone. The distance d1 is the z distance between the transmitter and the receiver coils. When the receiver obtains measurements to obtain its reference Q-factor value Qref, the distance d1 is fixed at 2 mm.

At operation 614, object detection method 600 determines (e.g., by the controller 226 of FIG. 2, without limitation) an expected reference Q-factor value Qr had the receiver been placed on an MP-A1 type transmitter with a z-distance of 2 mm instead of the instant transmitter with a known z distance of dt. A value for the distance dt is known to the transmitter depending on its mechanical design. For example, the distance dt may be the distance from a top of the transmitter coil to a surface on which the receiver is placed. By way of non-limiting example, the distance dt may be in the range of two millimeters to ten millimeters. As previously mentioned, this distance dt for an MP-A1 transmitter is d1, which is two millimeters. For an MP-9 transmitter dt would be four millimeters. In order to compute the difference due to a distance dt between the transmitter and the receiver, a factor k is determined using the following equation:

$$k = \sqrt{\frac{L1*dt}{Lt*d1}}.$$

The following equations are used to compute the value of Qr based on the factor k:

$$L1c = L1 + k*Ls',$$

$$R1c = R1 + k*Rs', \text{ and}$$

$$Qr = W100 * \frac{L1c}{R1c}.$$

The value of Qr is the computed value of the receiver if it was placed on an MP-A1 coil. Note that this value of Qr is computed at a frequency of 100 kHz on the receiver and hence W100=$2\pi$*100 kHz is used for the computation. The value of Qr decreases if a foreign object is present because the presence of a foreign object inductively coupling to the receive coils tends to increase the effective R1c factor and/or decrease the effective L1c factor.

At decision 616, object detection method 600 compares the expected reference Q-factor value Qr with the reference Qref received from the receiver and determines the presence, or absence, of a foreign object responsive to the comparison. For example, object detection method 600 may determine that a foreign object is detected proximate to the transmit coil responsive to a comparison of the expected reference Q-factor value Qr to the reference Q-factor value Qref received from the wireless power receiver. Since the value of Qr tends to decrease if a foreign object is present, a foreign object may be proximate to the transmit coils if Qr is less than Qref. Accordingly, responsive to the expected reference Q-factor value Qr being less than the reference Q-factor value Qref r (Qr<Qref), object detection method 600 determines that a foreign object is detected at operation 618.

At decision 616, responsive to the expected reference Q-factor value Qr being equal to or greater than, the reference Q-factor value Qref received from the receiver (Qr≥Qref), object detection method 600 determines that a foreign object is not detected at operation 620.

If Qr is only slightly less than Qref, it may not be desirable to determine that a foreign object is detected because Qr may be only slightly less than Qref due to signal noise, imperfections in estimations made in calculating Qr, imperfections in Qref, or some other factor. As a result, in some embodiments, decision 616 may including comparing Qr to a value that is somewhat less than Qref. By way of non-limiting example, Qr may be compared to Qref multiplied by a tolerance factor T at decision 616. In this example, at operation 618 object detection method 600 determines that a foreign object is detected if Qr<T*Qref, and at operation 620 object detection method 600 determines that no foreign object is detected if Qr≥T*Qref. In some embodiments the factor T may be set to 10% for tolerance and measurement accuracy. In such embodiments, object detection method 600 determines that a foreign object is detected at operation 618 if Qr<0.9*Qref. If no tolerance factor is desired the tolerance factor may be set to T=1. It is noted that instead of multiplying Qref by a tolerance factor T, a positive threshold value Th may be subtracted from Qref (e.g., decision 616 may include comparing Qr to Qr−Th) to provide tolerance.

It should be noted that that in the above measurements and computations an inductive impedance value X value may be used in place of an inductance L in order to simplify computations and reduce computational errors.

It should also be noted that placement of the receiver proximate to the transmitter has an impact on measurements taken at the transmitter. If the center of the receive coil is perfectly aligned with the center of the transmit coil, alignment may be perfect. In practical cases, however, the receive coil may have an x-y offset from the transmit coil center. This can be corrected by using the value of signal strength sent by the receiver to the transmitter (e.g., when the receiver transmits Qref to the transmitter). The signal strength (SS) value indicates the coefficient of coupling between the transmit and receive coils. The SS value may be highest when the centers are aligned. Likewise, the SS value may be less than the highest when the receive coil is moved away from the transmit coils. This effect impacts Ls' and Rs', and can be compensated for by modifying the k factor as shown in the following equation:

$$k = \sqrt{\frac{L1*dt*SSm}{Lt*d1*SSi}}.$$

where SSm denotes the measured signal strength value while SSi is the theoretical maximum signal strength value expected with the transmit coils at the distance of dt from the receive coil.

Figure 7:
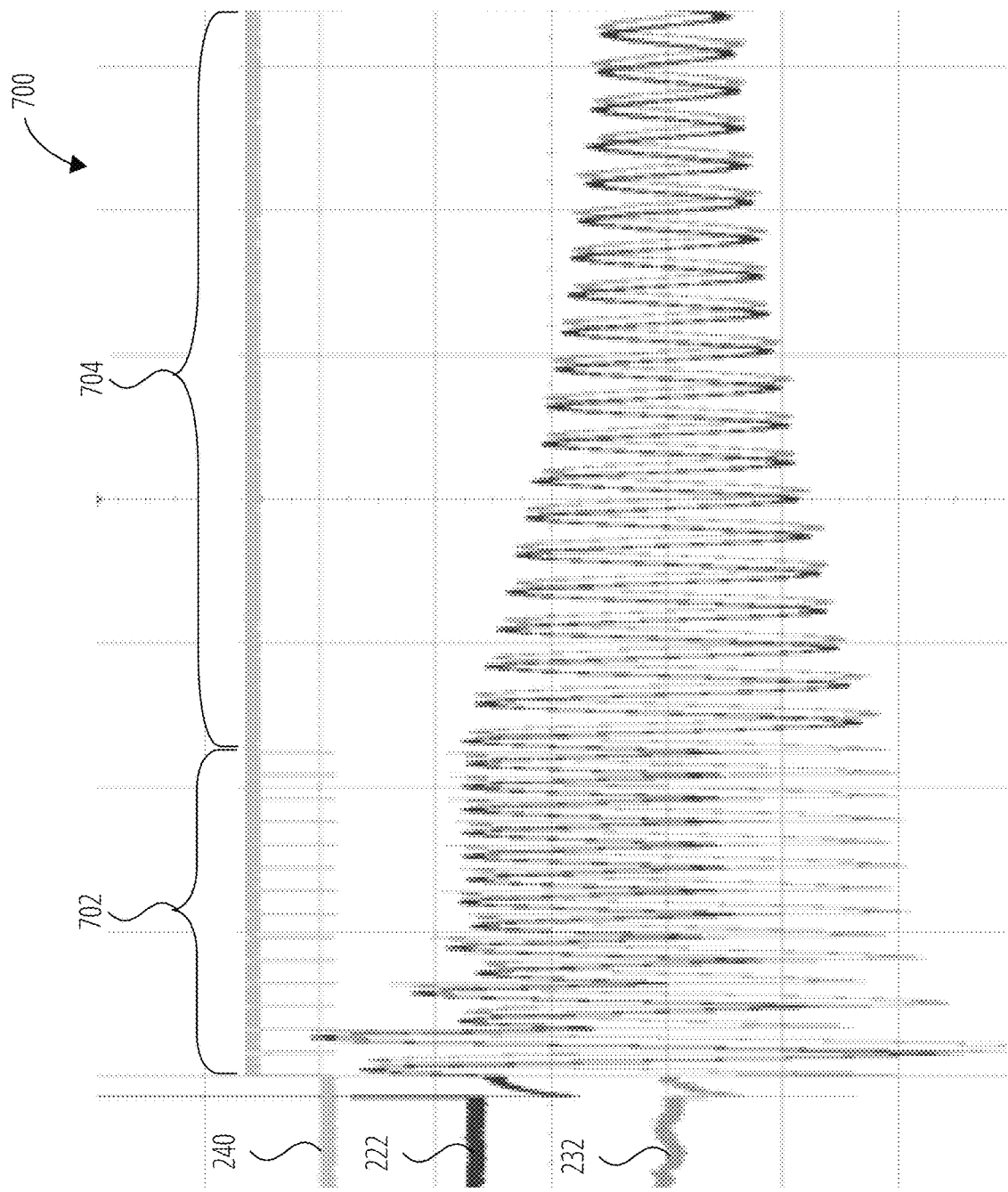
FIG. 7 is a plot illustrating an alternating current (AC) control signals, a coil voltage potential, and a coil current of the wireless power system of FIG. 2 plotted against time.

FIG. 7 is a plot 700 illustrating one of the AC control signals 240, the coil voltage potential 222, and the coil current representation 232 of the wireless power system 200 of FIG. 2 plotted against time. The plot 600 illustrates that the AC control signals 240 is turned on during an AC signal on period of time 702, then turned off for a data collection period of time 704. By way of non-limiting example, a controller (e.g., controller 226 of FIG. 2) may perform the data collection method 400 (FIG. 4) during the data collection period of time 704.

Figure 8:
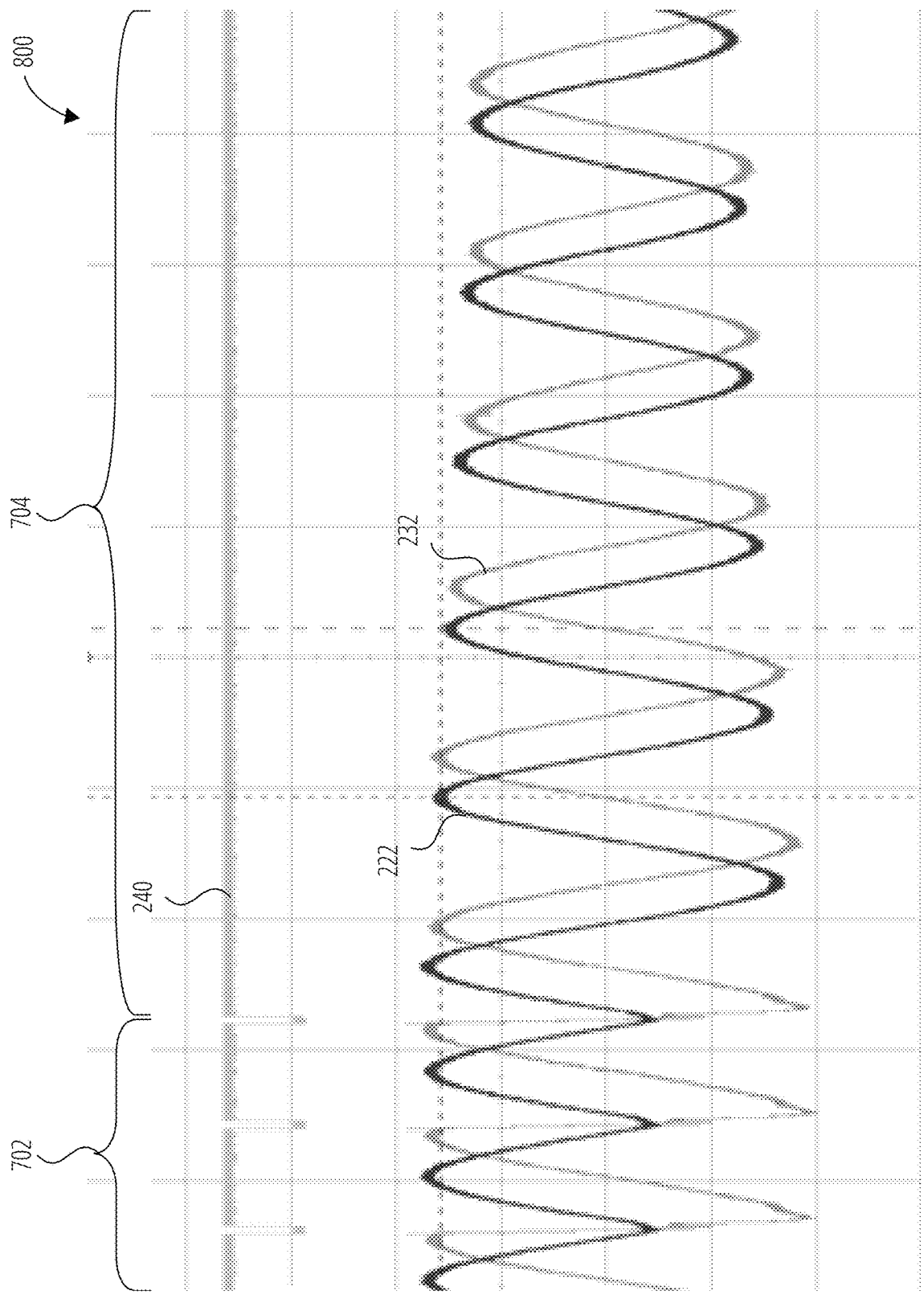
FIG. 8 is a plot illustrating a zoomed-in version of the plot of FIG. 6 near a transition between an AC signal on period of time and a data collection period of time.

FIG. 8 is a plot 800 illustrating a zoomed-in version of the plot 700 near a transition between an AC signal on period of time 702 and a data collection period of time 704. AC control signals 240 are shown oscillating during the on period of time 702, then remaining at a DC value during the data collection period of time 704. The resonant tank resonates at the resonant frequency fr during the data collection period of time 704, as seen in both the coil voltage potential 222 and the coil current representation 232 (which is approximately ninety degrees out of phase with the coil voltage potential 222).

Figure 9:
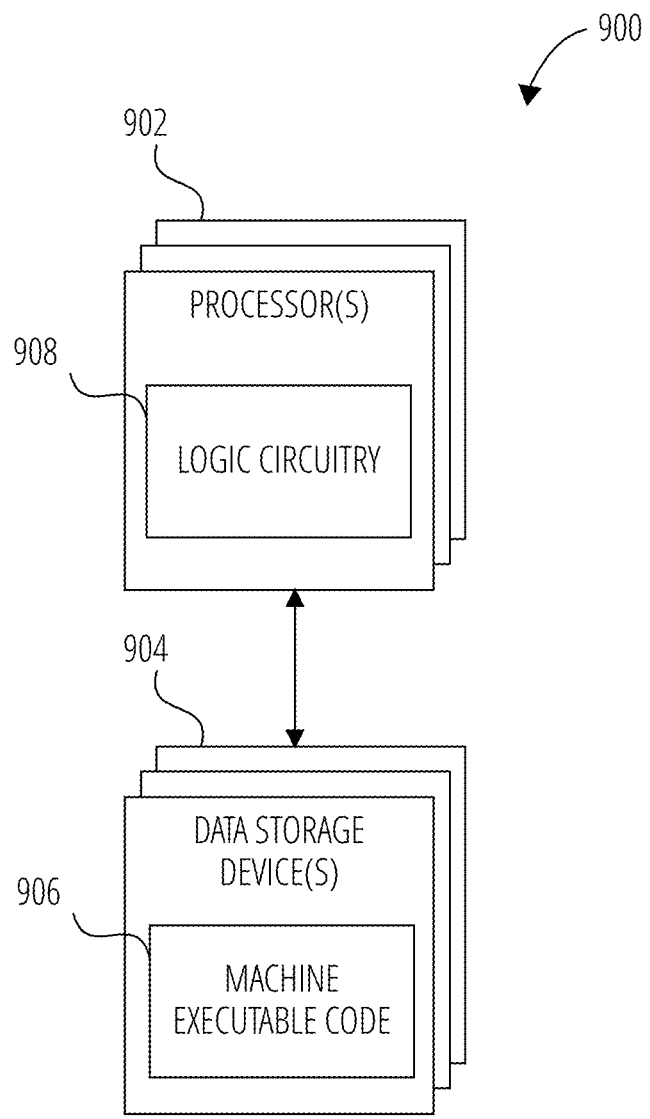
FIG. 9 is a block diagram of circuitry that, in some embodiments, may be used to implement various functions, operations, acts, processes, and/or methods disclosed herein.

FIG. 9 is a block diagram of circuitry 900 that, in some embodiments, may be used to implement various functions, operations, acts, processes, and/or methods disclosed herein. The circuitry 900 includes one or more processors 902 (sometimes referred to herein as "processors 902") operably coupled to one or more data storage devices (sometimes referred to herein as "storage 904"). The storage 904 includes machine executable code 906 stored thereon and the processors 902 include logic circuitry 908. The machine executable code 906 includes information describing functional elements that may be implemented by (e.g., performed by) the logic circuitry 908. The logic circuitry 908 is adapted to implement (e.g., perform) the functional elements described by the machine executable code 906. The circuitry 900, when executing the functional elements described by the machine executable code 906, should be considered as special purpose hardware configured for carrying out functional elements disclosed herein. In some embodiments the processors 902 may be configured to perform the functional elements described by the machine executable code 906 sequentially, concurrently (e.g., on one or more different hardware platforms), or in one or more parallel process streams.

When implemented by logic circuitry 908 of the processors 902, the machine executable code 906 is configured to adapt the processors 902 to perform operations of embodiments disclosed herein. For example, the machine executable code 906 may be configured to adapt the processors 902 to perform at least a portion or a totality of the data collection method 400 of FIG. 4, and/or the data collection method 500 of FIG. 5 and/or the object detection method 600 of FIG. 6. As another example, the machine executable code 906 may be configured to adapt the processors 902 to perform at least a portion or a totality of the operations discussed for the controller 226 of FIG. 2. As a further example, the machine executable code 906 may be configured to adapt the processors 902 to perform at least a portion or a totality of the operations discussed for the processing core 220 of FIG. 2. As a specific, non-limiting example, the machine executable code 906 may be configured to adapt the processors 902 to perform at least a portion of the object detection operations discussed herein.

The processors 902 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 906 (e.g., software code, firmware code, hardware descriptions)

related to embodiments of the present disclosure. It is noted that a general-purpose processor (may also be referred to herein as a host processor or simply a host) may be a microprocessor, but in the alternative, the processors 902 may include any conventional processor, controller, microcontroller, or state machine. The processors 902 may also be implemented as a combination of computing devices, such as a combination of a DSP and a microprocessor, a plurality of microprocessors, one or more microprocessors in conjunction with a DSP core, or any other such configuration.

In some embodiments the storage 904 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 902 and the storage 904 may be implemented into a single device (e.g., a semiconductor device product, a system on chip (SOC), etc.). In some embodiments the processors 902 and the storage 904 may be implemented into separate devices.

In some embodiments the machine executable code 906 may include computer-readable instructions (e.g., software code, firmware code). By way of non-limiting example, the computer-readable instructions may be stored by the storage 904, accessed directly by the processors 902, and executed by the processors 902 using at least the logic circuitry 908. Also by way of non-limiting example, the computer-readable instructions may be stored on the storage 904, transferred to a memory device (not shown) for execution, and executed by the processors 902 using at least the logic circuitry 908. Accordingly, in some embodiments the logic circuitry 908 includes electrically configurable logic circuitry 908.

In some embodiments the machine executable code 906 may describe hardware (e.g., circuitry) to be implemented in the logic circuitry 908 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 908 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 906 may include an HDL, an RTL, a GL description, a mask level description, other hardware description, or any combination thereof.

In embodiments where the machine executable code 906 includes a hardware description (at any level of abstraction), a system (not shown, but including the storage 904) may be configured to implement the hardware description described by the machine executable code 906. By way of non-limiting example, the processors 902 may include a programmable logic device (e.g., an FPGA or a PLC) and the logic circuitry 908 may be electrically controlled to implement circuitry corresponding to the hardware description into the logic circuitry 908. Also by way of non-limiting example, the logic circuitry 908 may include hard-wired logic manufactured by a manufacturing system (not shown, but including the storage 904) according to the hardware description of the machine executable code 906.

Regardless of whether the machine executable code 906 includes computer-readable instructions or a hardware description, the logic circuitry 908 is adapted to perform the functional elements described by the machine executable code 906 when implementing the functional elements of the machine executable code 906. It is noted that although a hardware description may not directly describe functional elements, a hardware description indirectly describes functional elements that the hardware elements described by the hardware description are capable of performing.

EXAMPLES

A non-exhaustive, non-limiting list of example embodiments follows. Not each of the example embodiments listed below are explicitly and individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1

A controller for a wireless power transmitter, the controller comprising: an analog to digital converter configured to sample at least one of a coil voltage potential and a coil current representation of a transmit coil; and a processing core configured to: determine an expected reference Q-factor value responsive to the at least one of the sampled coil voltage potential and the sampled coil current representation; compare the expected reference Q-factor value to a reference Q-factor value received from a wireless power receiver; and determine that a foreign object is detected proximate to the transmit coil responsive to a comparison of the expected reference Q-factor value to the reference Q-factor value received from the wireless power receiver.

Example 2

The controller of Example 1, wherein the processing core is configured to determine the expected reference Q-factor value responsive to determined resistance and inductive impedance values of a tank circuit of the wireless power transmitter with the wireless power receiver positioned proximate to the transmit coil and without the wireless power receiver positioned proximate to the transmit coil, the determined resistance and inductive impedance values determined responsive to the at least one of the sampled coil voltage potential and the sampled coil current representation of the transmit coil.

Example 3

The controller according to any one of Examples 1 and 2, wherein the processing core is configured to determine the expected reference Q-factor value responsive to peak values of the at least one of the sampled coil voltage potential and the sampled coil current representation.

Example 4

The controller of Example 3, wherein the processing core is further configured to determine resonant frequencies of a tank circuit with the wireless power receiver positioned proximate to the transmit coil and without the wireless power receiver positioned proximate to the transmit coil responsive to the peak values of the at least one of the sampled coil voltage potential and the sampled coil current representation.

Example 5

The controller according to any one of Examples 1-4, wherein the processing core is configured to determine that: the foreign object is detected proximate to the transmit coil responsive to a determination that the expected reference Q-factor value is less than the reference Q-factor value multiplied by a tolerance factor; and the foreign object is not detected proximate to the transmit coil responsive to a determination that the expected Q-factor value is not less than the reference Q-factor value multiplied by the tolerance factor.

Example 6

A wireless power transmitter, comprising: a tank circuit including a transmit coil configured to inductively couple to a receive coil of a wireless power receiver; and a controller configured to: sample a coil voltage potential and a coil current representation of the transmit coil with the receive coil proximate to the transmit coil; determine an expected reference Q-factor value that would be expected between a pre-defined wireless power transmitter and the wireless power receiver responsive to the sampled coil voltage potential and the sampled coil current representation; and determine whether a foreign object is located proximate to the transmit coil by comparing the expected reference Q-factor value to a reference Q-factor value received from the wireless power transmitter.

Example 7

The wireless power transmitter of Example 6, wherein the controller is configured to determine that the foreign object is located proximate to the transmit coil responsive to a determination that the expected reference Q-factor value is less than a tolerance factor times the reference Q-factor value received from the wireless power receiver.

Example 8

The wireless power transmitter of Example 6, wherein the controller is configured to determine that the foreign object is located proximate to the transmit coil responsive to a determination that the expected reference Q-factor value is less than the reference Q-factor value received from the wireless power receiver.

Example 9

The wireless power transmitter according to any one of Examples 6-8, wherein the controller is configured to identify peaks in the sampled coil voltage potential and in the sampled coil current representation, determine a resonant frequency of the tank circuit responsive to the identified peaks, determine an inductive impedance of the tank circuit responsive to the determined resonant frequency, determine a Q-factor of the wireless power transmitter responsive to the identified peaks, and determine a resistance of the tank circuit responsive to the determined resonant frequency of the tank circuit, the determined inductive impedance of the tank circuit and the determined Q-factor of the wireless power transmitter.

Example 10

The wireless power transmitter of Example 9, wherein the controller is configured to determine the resonant frequency of the tank circuit by dividing a sample frequency used to sample the coil voltage potential and the coil current representation by a quotient, the quotient including a difference between a sample number corresponding to a first peak and a subsequent sample number corresponding to a kth peak divided by k.

Example 11

The wireless power transmitter according to any one of Examples 9 and 10, wherein the controller is configured to determine the inductive impedance of the tank circuit to be an identified peak in the sampled coil voltage potential divided by a product between a corresponding identified peak in the sampled coil current representation, two, pi, and a determined resonant frequency of the tank circuit.

Example 12

The wireless power transmitter according to any one of Examples 9-11, wherein the controller is configured to determine the reflective inductance of the receive coil on the transmit coil by subtracting the determined inductive impedance of the tank circuit with the receive coil in proximity to the transmit coil from a determined inductive impedance of the tank circuit without the receive coil in proximity to the transmit coil.

Example 13

The wireless power transmitter according to any one of Examples 9-12, wherein the controller is configured to determine the reflective resistance of the receive coil on the transmit coil by subtracting a determined resistance of the tank circuit with the receive coil in proximity to the transmit coil from a determined resistance of the tank circuit without the receive coil in proximity to the transmit coil.

Example 14

A method of determining whether a foreign object is located in proximity to a transmit coil of a wireless power transmitter, the method comprising: sampling a coil voltage potential of the transmit coil; sampling a coil current representation of a coil current of the transmit coil; determining an expected reference Q-factor value between a pre-defined wireless power transmitter and a wireless power receiver based on the sampled coil voltage potential and the sampled coil current representation; and determining that a foreign object is detected responsive to a comparison of the expected reference Q-factor value to the reference Q-factor value received from the wireless power receiver.

Example 15

The method of Example 14, wherein sampling the coil voltage potential and the coil current representation comprises: applying an alternating current (AC) signal to a tank circuit including the transmit coil; determining whether the AC signal has completed application to the tank circuit; sampling the coil voltage potential and the coil current representation responsive to a determination that the AC signal has completed application to the tank circuit; and determining whether a number of samples collected has reached a predetermined number of samples.

Example 16

The method according to any one of Examples 14 and 15, wherein determining the expected reference Q-factor value comprises identifying peaks in the sampled coil voltage potential values and in the sampled coil current values and determining the expected reference Q-factor value based, at least in part, on the identified peaks.

Example 17

The method of Example 16, wherein determining the expected reference Q-factor value comprises determining a resonant frequency of a tank circuit responsive to the identified peaks and determining the expected reference Q-factor value based, at least in part, on the determined resonant frequency.

Example 18

The method according to any one of Examples 16 and 17, wherein determining the expected reference Q-factor value comprises determining a Q-factor of the wireless power transmitter responsive to the identified peaks and determining the expected reference Q-factor value based, at least in part, on the Q-factor.

Example 19

The method according to any one of Examples 14-18, wherein determining the expected reference Q-factor value comprises determining a reflective inductance of a receive coil of the wireless power receiver on the transmit coil and determining a reflected resistance of the receive coil on the transmit coil and determining the expected reference Q-factor value based, at least in part, on the determined reflective inductance and the determined reflected resistance.

Example 20

The method according to any one of Examples 14-19, further comprising determining that no foreign object is detected responsive to a determination that the expected reference Q-factor value is less than a tolerance factor times the reference Q-factor value.

Example 21

A controller for a wireless power transmitter, the controller comprising: an analog to digital converter configured to sample at least one of a coil voltage potential and a coil current of a transmit coil; and a processing core configured to: determine an expected reference Q-factor value responsive to the at least one of the sampled coil voltage potential and the sampled coil current; compare the expected reference Q-factor value to a reference Q-factor value received from a wireless power receiver; and determine that a foreign object is detected proximate to the transmit coil responsive to a determination that the expected Q-factor value is less than a tolerance factor multiplied by the reference Q-factor value received from the wireless power receiver.

Example 22

The controller of Example 21, wherein the processing core is configured to determine the expected reference Q-factor value responsive to determined resistance and inductive impedance values of a tank circuit of the wireless power transmitter with a wireless power receiver positioned proximate to the transmit coil and without the wireless power receiver positioned proximate to the transmit coil, the determined resistance and inductive impedance values determined responsive to the at least one of the sampled coil voltage potential and the sampled coil current of the transmit coil.

Example 23

The controller according to any one of Examples 21 and 22, wherein the processing core is configured to determine the expected reference Q-factor value responsive to peak values of the at least one of the sampled coil voltage potential and the sampled coil current.

Example 24

The controller of Example 23, wherein the processing core is further configured to determine resonant frequencies of a tank circuit with a wireless power receiver positioned proximate to the transmit coil and without the wireless power receiver positioned proximate to the transmit coil responsive to the peak values of the at least one of the sampled coil voltage potential and the sampled coil current.

Example 25

The controller according to any one of Examples 21-24, wherein the processing core is configured to determine that a foreign object is not detected proximate to the transmit coil responsive to a determination that the expected Q-factor value is greater than or equal to the tolerance factor multiplied by the reference Q-factor value received from the wireless power receiver.

CONCLUSION

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A controller for a wireless power transmitter, the controller comprising:
    an analog to digital converter to sample at least one of a coil voltage potential and a coil current representation of a transmit coil inductively coupled to a receive coil of a wireless power receiver with a distance between the transmit coil and the receive coil; and
    a processing core to:
        determine an expected reference Q-factor value responsive to the at least one of the sampled coil voltage potential and the sampled coil current representation, the expected reference Q-factor value indicating a Q-factor value expected at a predetermined reference wireless power transmitter inductively coupled to the wireless power receiver with a reference distance from a reference transmit coil of the predetermined reference wireless power transmitter to the receive coil of the wireless power receiver, the predetermined reference wireless power transmitter different from the wireless power transmitter, the determination of the expected reference Q-factor value taking into consideration any difference between the distance and the reference distance;
        compare the expected reference Q-factor value to a reference Q-factor value received from the wireless power receiver; and
        determine that a foreign object is detected proximate to the transmit coil responsive to a comparison of the expected reference Q-factor value to the reference Q-factor value received from the wireless power receiver.

2. The controller of claim 1, wherein the processing core is to determine the expected reference Q-factor value responsive to determined resistance and inductive impedance values of a tank circuit of the wireless power transmitter with the wireless power receiver positioned proximate to the transmit coil and without the wireless power receiver positioned proximate to the transmit coil, the determined resistance and inductive impedance values determined responsive to the at least one of the sampled coil voltage potential and the sampled coil current representation of the transmit coil.

3. The controller of claim 1, wherein the processing core is to determine the expected reference Q-factor value responsive to peak values of the at least one of the sampled coil voltage potential and the sampled coil current representation.

4. The controller of claim 3, wherein the processing core is to determine resonant frequencies of a tank circuit with the wireless power receiver positioned proximate to the transmit coil and without the wireless power receiver positioned proximate to the transmit coil responsive to the peak values of the at least one of the sampled coil voltage potential and the sampled coil current representation.

5. The controller of claim 1, wherein the processing core is to determine that:
    the foreign object is detected proximate to the transmit coil responsive to a determination that the expected reference Q-factor value is less than the reference Q-factor value multiplied by a tolerance factor; and
    the foreign object is not detected proximate to the transmit coil responsive to a determination that the expected reference Q-factor value is not less than the reference Q-factor value multiplied by the tolerance factor.

6. A wireless power transmitter, comprising:
    a tank circuit including a transmit coil to inductively couple to a receive coil of a wireless power receiver; and
    a controller to:
        sample at least one of a coil voltage potential or a coil current representation of the transmit coil with the receive coil at a distance from the transmit coil;
        determine, responsive to the at least one of the sampled coil voltage potential or the sampled coil current representation, an expected reference Q-factor value that would be expected between a pre-defined wireless power transmitter that is different from the wireless power transmitter and the wireless power receiver with the receive coil at a reference distance from a reference transmit coil of the pre-defined wireless power transmitter, the determination of the expected reference Q-factor value taking into consideration any difference between the distance and the reference distance; and determine whether a foreign object is located proximate to the transmit coil by comparing the expected reference Q-factor value to a reference Q-factor value received from the wireless power receiver.

7. The wireless power transmitter of claim 6, wherein the controller is to determine that the foreign object is located proximate to the transmit coil responsive to a determination that the expected reference Q-factor value is less than a tolerance factor times the reference Q-factor value received from the wireless power receiver.

8. The wireless power transmitter of claim 6, wherein the controller is to determine that the foreign object is located proximate to the transmit coil responsive to a determination that the expected reference Q-factor value is less than the reference Q-factor value received from the wireless power receiver.

9. The wireless power transmitter of claim 6, wherein the controller is to identify peaks in the at least one of the sampled coil voltage potential or the sampled coil current representation, determine a resonant frequency of the tank circuit responsive to the identified peaks, determine an inductive impedance of the tank circuit responsive to the determined resonant frequency, determine a Q-factor of the wireless power transmitter responsive to the identified peaks, and determine a resistance of the tank circuit responsive to the determined resonant frequency of the tank circuit, the determined inductive impedance of the tank circuit and the determined Q-factor of the wireless power transmitter.

10. The wireless power transmitter of claim 9, wherein the controller is to determine the resonant frequency of the tank circuit by dividing a sample frequency used to sample the at least one of the coil voltage potential and the coil current representation by a quotient, the quotient including a difference between a sample number corresponding to a first peak and a subsequent sample number corresponding to a kth peak divided by k.

11. The wireless power transmitter of claim 9, wherein the controller is to determine the inductive impedance of the tank circuit to be an identified peak in the sampled coil voltage potential divided by a product between a corresponding identified peak in the sampled coil current representation, two, pi, and a determined resonant frequency of the tank circuit.

12. The wireless power transmitter of claim 9, wherein the controller is to determine reflective inductance of the receive coil on the transmit coil by subtracting the determined inductive impedance of the tank circuit with the receive coil in proximity to the transmit coil from a determined inductive impedance of the tank circuit without the receive coil in proximity to the transmit coil.

13. The wireless power transmitter of claim 9, wherein the controller is to determine reflective resistance of the receive coil on the transmit coil by subtracting a determined resistance of the tank circuit with the receive coil in proximity to the transmit coil from a determined resistance of the tank circuit without the receive coil in proximity to the transmit coil.

14. A method of determining whether a foreign object is located in proximity to a transmit coil of a wireless power transmitter, the method comprising:

sampling at least one of a coil voltage potential or a coil current representation of the transmit coil at a distance from a receive coil of a wireless power receiver;

determining an expected reference Q-factor value of a pre-defined wireless power transmitter including a reference transmit coil at a reference distance from the receive coil, the pre-defined wireless power transmitter different from the wireless power transmitter, the determining based at least on the at least one of the sampled coil voltage potential or the sampled coil current representation and any difference between the distance and the reference distance; and determining that a foreign object is detected responsive to a comparison of the expected reference Q-factor value to the reference Q-factor value received from the wireless power receiver.

15. The method of claim 14, wherein sampling the at least one of the coil voltage potential or the coil current representation comprises:

applying an alternating current (AC) signal to a tank circuit including the transmit coil;

determining whether the AC signal has completed application to the tank circuit;

sampling the at least one of the coil voltage potential or the coil current representation responsive to a determination that the AC signal has completed application to the tank circuit; and determining whether a number of samples collected has reached a predetermined number of samples.

16. The method of claim 14, wherein determining the expected reference Q-factor value comprises identifying peaks in the sampled coil voltage potential values and in the sampled coil current values and determining the expected reference Q-factor value based, at least in part, on the identified peaks.

17. The method of claim 16, wherein determining the expected reference Q-factor value comprises determining a resonant frequency of a tank circuit responsive to the identified peaks and determining the expected reference Q-factor value based, at least in part, on the determined resonant frequency.

18. The method of claim 16, wherein determining the expected reference Q-factor value comprises determining a Q-factor of the wireless power transmitter responsive to the identified peaks and determining the expected reference Q-factor value based, at least in part, on the Q-factor.

19. The method of claim 14, wherein determining the expected reference Q-factor value comprises determining a reflective inductance of a receive coil of the wireless power receiver on the transmit coil and determining a reflected resistance of the receive coil on the transmit coil and determining the expected reference Q-factor value based, at least in part, on the determined reflective inductance and the determined reflected resistance.

20. The method of claim 14, comprising determining that a foreign object is detected responsive to a determination that the expected reference Q-factor value is less than a tolerance factor times the reference Q-factor value.

* * * * *

UNITED STATES PATENT AND TRADEMARK OFFICE
CERTIFICATE OF CORRECTION

PATENT NO. : 11,264,842 B2
APPLICATION NO. : 16/949003
DATED : March 1, 2022
INVENTOR(S) : Santosh Bhandarkar It is certified that error appears in the above-identified patent and that said Letters Patent is hereby corrected as shown below:

In the Specification

Column 16, Line 5, change "24 pH" to --24 µH--

Signed and Sealed this
Third Day of May, 2022

Katherine Kelly Vidal
*Director of the United States Patent and Trademark Office*